(12) United States Patent
Kang et al.

(10) Patent No.: US 8,779,347 B2
(45) Date of Patent: Jul. 15, 2014

(54) MULTICHANNEL DETECTOR HAVING A REDUCED NUMBER OF OUTPUT CHANNELS

(75) Inventors: Jihoon Kang, Jeollanam-do (KR); Yong Choi, Seoul (KR); Jin Ho Jung, Gyeonggii-do (KR)

(73) Assignee: Industry-University Cooperation Foundation Sogang University, Seoul (KR)

( * ) Notice: Subject to any disclaimer, the term of this patent is extended or adjusted under 35 U.S.C. 154(b) by 0 days.

(21) Appl. No.: 13/988,619

(22) PCT Filed: Oct. 25, 2011

(86) PCT No.: PCT/KR2011/007948
§ 371 (c)(1),
(2), (4) Date: Aug. 7, 2013

(87) PCT Pub. No.: WO2012/070777
PCT Pub. Date: May 31, 2012

(65) Prior Publication Data
US 2014/0048692 A1    Feb. 20, 2014

(30) Foreign Application Priority Data
Nov. 22, 2010    (KR) .................. 10-2010-0116444

(51) Int. Cl.
*H01J 40/14*    (2006.01)

(52) U.S. Cl.
USPC .............. 250/214 R; 250/214 C; 330/124 R

(58) Field of Classification Search
USPC .......... 250/214 R, 214 A, 214 LA, 214 AG, 250/214 C, 214 RC; 327/514, 515; 330/59, 330/124 R, 148
See application file for complete search history.

(56) References Cited

U.S. PATENT DOCUMENTS

| | | | |
|---|---|---|---|
| 6,597,007 B2* | 7/2003 | Mizuno et al. | 250/559.38 |
| 2011/0081152 A1* | 4/2011 | Agazzi et al. | 398/135 |
| 2011/0285866 A1* | 11/2011 | Bhrugumalla et al. | 348/218.1 |

* cited by examiner

*Primary Examiner* — Kevin Pyo
(74) *Attorney, Agent, or Firm* — Alston & Bird LLP

(57) ABSTRACT

The present disclosure relates to a multi-channel detector having a reduced number of output channels and including: a linear amplifier linearly amplifying an input signal; an offset correcting unit configured by a circuit that is independent from the linear amplifier, including an operational amplifier inside, and correcting an offset level that changes in accordance with an amplification rate of the operational amplifier; a uniformity correcting unit reducing a non-uniform characteristic of the input signal by finely adjusting a gain of an output signal of the linear amplifier; a signal delay unit delaying an output signal of the uniformity correcting unit until a time point when output signals are generated from a comparison unit and a signal determining unit, and a switch circuit receives a trigger from the signal determining unit; a comparison unit comparing the output signal of the uniformity correcting unit with a signal of a predetermined level with each other; a signal determining unit receiving a trigger signal from the comparison unit, determining channel position information of a channel in which an event occurs, transmitting a trigger signal to a switch circuit located at the determined channel position, and outputting the determined position information; and a channel information processing unit receiving energy information, time information, or the channel position information of a channel in which an event occurs as input when a trigger signal is input from the signal determining unit to the switch circuit located at the determined channel position.

11 Claims, 4 Drawing Sheets

MULTICHANNEL DETECTOR HAVING A REDUCED NUMBER OF OUTPUT CHANNELS

TECHNICAL FIELD

The present disclosure relates to a multi-channel photodetector, and more particularly, to a multi-channel detector having a reduced number of output channels which provides not only channel position information and energy information for the occurrence of an event but also time information by additionally using a clock generator and a signal discrimination circuit.

BACKGROUND ART

A winner take all (WTA) circuit is called by various names such as a winner-take-all circuit, a maximum/minimum value extractor, a maximum/minimum level circuit, and a position determining circuit and is widely used in a various industrial fields such as a multi-channel optical array detector application technology and a logic circuit neural network system.

Circuits developed until now provide only the positions and amplitude of channels having a maximum/minimum voltage value or current value input during a predetermined time by using only a switching function of a transistor. In other words, a capability of determining an accurate time at which a response is generated is not provided. In addition, according to conventional technologies, it is difficult to simultaneously correct an offset error occurring due to a level difference between input voltages and a response position output error and count losses in a situation in which a plurality of input signals having the same magnitude are generated.

Furthermore, a conventional position determining algorithm uses a method in which maximum/minimum of voltage values are divided. However, in an industrial field in which a light source having a specific magnitude is to be detected in a situation in which various light sources are present, it is difficult to use the above-described prior arts. For example, in an industrial field of a light source analysis or the like in which the degree of the occurrence frequency of a light source having a magnitude of 200 mV and a probability distribution of response positions thereof are analyzed in a situation in which various light sources having energy levels of 100, 200, 300, and 400 mV are present, an algorithm capable of detecting only a specific signal level is required.

In addition, in an industrial field in which the position of a response input first is to be acquired from among input signals having a predetermined or higher voltage level, it is difficult to use the above-described prior arts. For example, an algorithm is necessary which can be applied to a situation in which a signal according to a fastest response is to be extracted from among a plurality of input signals in a case where a coincidence event is measured using two detectors as in the case of a PET imaging equipment.

DISCLOSURE

Technical Problem

This disclosure is directed to providing a multi-channel detector having a reduced number of output channels capable of providing not only channel position information and energy information for the occurrence of an event but also time information by additionally using a clock generator and a signal discrimination circuit.

Technical Solution

In one general aspect, there is provided a multi-channel detector, which has a reduced number of output channels, including: a linear amplifier linearly amplifying an input signal; an offset correcting unit configured by a circuit that is independent from the linear amplifier, including an operational amplifier inside, and correcting an offset level that changes in accordance with an amplification rate of the operational amplifier; a uniformity correcting unit reducing a non-uniform characteristic of the input signal by finely adjusting a gain of an output signal of the linear amplifier; a signal delay unit delaying an output signal of the uniformity correcting unit until a time point when output signals are generated from a comparison unit and a signal determining unit, and a switch circuit receives a trigger from the signal determining unit; a comparison unit comparing the output signal of the uniformity correcting unit with a signal of a predetermined level with each other; a signal determining unit receiving a trigger signal from the comparison unit, determining channel position information of a channel in which an event occurs, transmitting a trigger signal to a switch circuit located at the determined channel position, and outputting the determined position information; and a channel information processing unit receiving energy information, time information, or the channel position information of a channel in which an event occurs as input when a trigger signal is input from the signal determining unit to the switch circuit located at the determined channel position.

In the aspect above, the comparison unit may include: a lower-limit setting comparator determining whether the output signal of the uniformity correcting unit has a voltage of a predetermined level or higher; and an upper-limit setting comparator determining whether the output signal of the uniformity correcting unit has a voltage of a predetermined level or lower.

In addition, the channel information processing unit may include: an energy information output unit receiving an output signal of the signal delay unit as the energy information when a trigger signal is input from the signal determining unit to the switch circuit; a time information output unit receiving a trigger signal from the comparison unit or the signal determining unit as input and determining the time information; and a position information output unit receiving the channel position information of a channel in which an event occurs as input.

At this time, it is preferable that the channel information processing unit outputs the energy information, the time information, and the channel position information of a channel in which an event occurs, which are received, together.

In addition, the lower-limit setting comparator and the upper-limit setting comparator may be configured to be in parallel or serial with each other. Furthermore, an event having a voltage of a specific level may be extracted by using the lower-limit setting comparator and the upper-limit setting comparator.

In addition, one or more trigger signals of each one of the lower-limit setting comparator and the upper-limit setting comparator may be configured to be output together.

In addition, the time information may include a final response time.

In addition, the channel information processing unit may determine a response time at which the event occurs when the channel position information of the channel in which the event occurs is received from the signal determining unit and further include a clock generator providing a clock signal for the channel information processing unit for determining the response time.

In addition, a plurality of the multi-channel detectors may be used, and an output channel reduction rate may be decreased or increased by the signal determining unit and the channel information processing unit being used by the multi-channel detectors to be common.

Advantageous Effects

According to the present disclosure, not only channel position information and energy information for the occurrence of an event but also time information can be provided by additionally using a clock generator and a signal determining circuit, and an offset error occurring in an operational amplifier can be corrected by using an independent offset correction unit. In addition, according to the present disclosure, a position determination error and count losses can be corrected by implementing a comparator and the signal determining circuit using a simultaneous algorithm, and an event having a specific level can be extracted by using a multi-comparator. Furthermore, according to the present disclosure, a fastest signal input can be extracted using a logic gate in the signal determining circuit.

DESCRIPTION OF DRAWINGS

The above and other aspects, features and advantages of the disclosed exemplary embodiments will be more apparent from the following detailed description taken in conjunction with the accompanying drawings in which.

BEST MODE

Before specific contents of the present disclosure are described, for the convenience of understanding, an overview of a solution for solving an object to be achieved by the present disclosure or the core of a technical idea will be presented first.

According to an embodiment of the present disclosure, there is provided a multi-channel detector, which has a reduced number of output channels, including: a linear amplifier linearly amplifying an input signal; an offset correcting unit configured by a circuit that is independent from the linear amplifier, including an operational amplifier inside, and correcting an offset level that changes in accordance with an amplification rate of the operational amplifier; a uniformity correcting unit reducing a non-uniform characteristic of the input signal by finely adjusting a gain of an output signal of the linear amplifier; a signal delay unit delaying an output signal of the uniformity correcting unit until a time point when output signals are generated from a comparison unit and a signal determining unit, and a switch circuit receives a trigger from the signal determining unit; a comparison unit comparing the output signal of the uniformity correcting unit with a signal of a predetermined level with each other; a signal determining unit receiving a trigger signal from the comparison unit, determining channel position information of a channel in which an event occurs, transmitting a trigger signal to a switch circuit located at the determined channel position, and outputting the determined position information; and a channel information processing unit receiving energy information, time information, or the channel position information of a channel in which an event occurs as input when a trigger signal is input from the signal determining unit to the switch circuit located at the determined channel position.

Exemplary embodiments now will be described more fully hereinafter with reference to the accompanying drawings, in which exemplary embodiments are shown. This disclosure may, however, be embodied in many different forms and should not be construed as limited to the exemplary embodiments set forth therein. Rather, these exemplary embodiments are provided so that this disclosure will be thorough and complete, and will fully convey the scope of this disclosure to those skilled in the art. In the description, details of well-known features and techniques may be omitted to avoid unnecessarily obscuring the presented embodiments.

[Mode for Invention]

Figure 1:
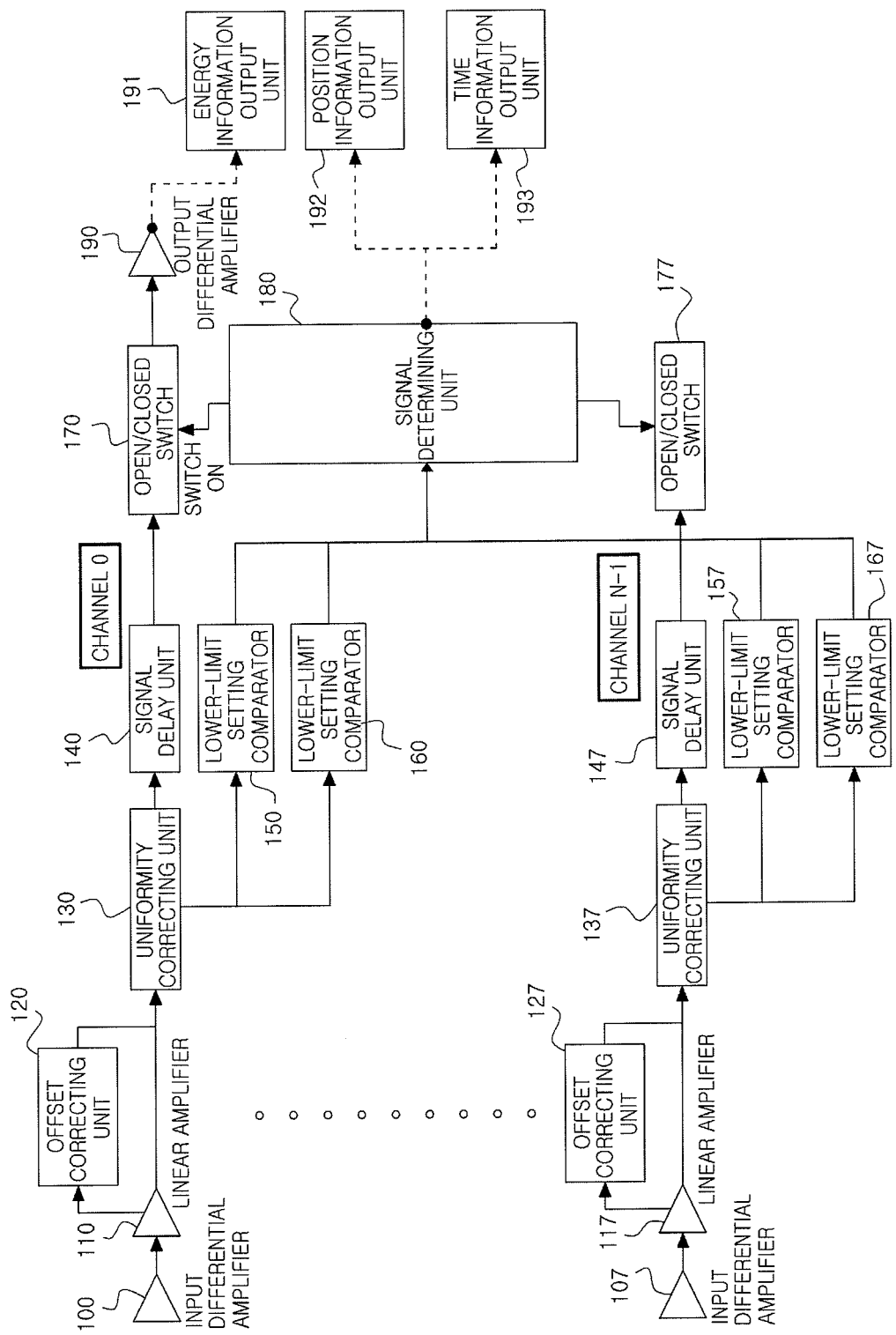
FIG. 1 illustrates a configuration diagram of a multi-channel detector having a reduced number of output channels according to an embodiment of the present disclosure.

FIG. 1 illustrates a configuration diagram of a multi-channel detector having a reduced number of output channels according to an embodiment of the present disclosure.

As illustrated in FIG. 1, the multi-channel detector according to this embodiment is configured by an input differential amplifier 100, a linear amplifier 110, an offset correcting unit 120, a uniformity correcting unit 130, a signal delay unit 140, a lower-limit setting comparator 150, an upper-limit setting comparator 160, an open/closed switch 170, a signal determining unit 180, an output differential amplifier 190, an energy information output unit 191, a position information output unit 192, and a time information output unit 193.

The input differential amplifier 100 has a high common-mode rejection ratio (CMRR) and may be combined with a photodetector having a single-ended input and a differential input, whereby the extensibility of the circuit can be increased.

The linear amplifier 110 amplifies an input signal with a high signal amplification rate ($10^0$ to $10^{10}$).

The offset correcting unit 120 precisely adjusts an offset level that changes in accordance with the amplification rate of the linear amplifier 110. An offset correcting circuit configuring the offset correcting unit 120 corrects a reference voltage through a capacitor parallel circuit. In addition, the offset correcting circuit is configured by a micropower, a voltage reference circuit, and an operational amplifier circuit and corrects the reference voltage. It is preferable that the offset correcting circuit does not belong to the linear amplifier 110 but is configured and operated as an independent circuit.

The uniformity correcting unit 130 finely adjusts the gain of an output signal of the linear amplifier 110 and corrects non-uniformity that is intrinsically present in a plurality of optical detectors. The uniformity correcting unit 130 may manually or automatically adjust a fine voltage using an analog or digital variable resistor. The output signal of the uniformity correcting unit 130 is transmitted to the signal delay unit 140, the lower-limit setting comparator 150, and the upper-limit setting comparator 160 in a divisional manner.

The signal delay unit 140 delays an analog signal until a time point when output signals are generated from the lower-limit setting comparator 150, the upper-limit setting comparator 160, and the signal determining unit 180, and the open/closed switch 170 receives a trigger signal. The signal delay unit 140 is configured by a multi-stage operational amplifiers having no signal distortion and no performance change, and the gains thereof are "1"s. The signal delay time is changeable from 1 ns to 1 μs and can be adjusted by changing the number of operational amplifiers or configuring a delay circuit.

The lower-limit setting comparator 150 is a circuit determining whether an input signal has a voltage of a predetermined level or higher. When an analog signal having a voltage level set in advance or higher is input, the lower-limit setting comparator 150 transmits a trigger signal to the signal determining unit 180. On the other hand, when an analog signal having the voltage level set in advance or lower is input, the lower-limit setting comparator 150 does not generate a trigger signal.

The upper-limit setting comparator 160 is a circuit determining whether an input signal has a voltage of a predetermined level or lower. When an analog signal having a voltage level set in advance or lower is input, the upper-limit setting comparator 160 transmits a trigger signal to the signal determining unit 180. On the other hand, when an analog signal having the voltage level set in advance or lower is input, the upper-limit setting comparator 160 does not generate a trigger signal.

The lower-limit setting comparator 150 and the upper-limit setting comparator 160 may be installed in a separate manner or an integral manner. By installing two comparator circuits, only a desired specific voltage level can be extracted instead of taking a limiting value such as a maximum or a minimum.

The lower-limit setting comparator 150 and the upper-limit setting comparator 160 may be configured as a parallel circuit as illustrated in FIG. 1 and output a trigger signal, or may be configured as a serial circuit so as to be configured in the form of a second-order comparator.

In addition, the lower-limit setting comparator 150 and the upper-limit setting comparator 160 may be respectively configured to output one or more trigger signals during a predetermined time.

Furthermore, the lower-limit setting comparator 150 and the upper-limit setting comparator 160 may be configured to transmit a trigger signal to the signal determining unit 180 and transmit a trigger signal to the time information output unit 193 so as to determine time information.

After the switch is closed in accordance with reception of an output signal of the signal determining unit 180, the open/closed switch 170 transmits an output signal of the signal delay unit 140 to the output differential amplifier 190.

The signal determining unit 180 finds out channel position information of a channel to which a signal matching a determined algorithm out of output signals of the lower-limit setting comparator 150 and the upper-limit setting comparator 160 is input, transmits a trigger signal to the open/closed switch 170 of a corresponding channel, and provides position information for the position information output unit 192 and the time information output unit 193.

The signal determining unit 180 is configured by logic circuits such as a field programmable gate array (FPGA) or a complex programmable logic device (CPLD) and can improve the extensibility and the applicability of the multi-channel detector.

The signal determining unit 180 detects a signal having a maximum/minimum value from among the output signals of the lower-limit setting comparator 150 and the upper-limit setting comparator 160. A multi-logic gate or a multiplexer (MUX) device is used as the comparator. This may operate using the same function as that of a general winner take all circuit.

The signal determining unit 180 detects a signal that is input first from among the output signals of the lower-limit setting comparator 150 and the upper-limit setting comparator 160. For this, the signal determining unit 180 detects a signal that is arrived first from the multiple logic gates connected in parallel.

The signal determining unit 180 transmits the channel position information of the channel in which an event occurs to the position information output unit 192 and the time information output unit 193. The channel position information is transmitted as digital signals using a parallel or serial signal transmission method. The channel position information may be converted into voltage values and be transmitted as analog signal, and a part receiving a final output of the multi-channel detector according to an embodiment of the present disclosure may be driven by additionally installing a decoder circuit. In addition, the channel position information may be transmitted as optical signals, and a part receiving a final output of the multi-channel detector according to an embodiment of the present disclosure may be driven by additionally installing an optical decoder circuit The signal determining unit 180 transmits the time information of a corresponding channel to the time information output unit 193 in the form of a trigger. A determination of a final response time may be determined by determining the order of generation with a clock signal of a clock generator (not illustrated in the figure) set as a reference point.

In order to correct a response position output error and count losses together in a situation in which a plurality of input signals having the same magnitude are generated, the lower-limit setting comparator 150, the upper-limit setting comparator 160, and the signal determining unit 180 are implemented together on an algorithm.

The output differential amplifier 190 is located at a position at which a final output-stage analog signal is generated. The output differential amplifier 190 may generate a signal in a single output form or a differential output form and includes an output offset correcting circuit and a gain correcting circuit.

When a trigger signal is input to the open/closed switch 170 from the signal determining unit 180, the energy information output unit 191 receives an output signal of the signal delay unit 140 and provides energy information of each event.

The position information output unit 192 receives the channel position information of channels at which events occur from the signal determining unit 180 and provides the channel positions of the events.

The time information output unit 193 receives trigger signals from the lower-limit setting comparator 150, the upper-limit setting comparator 160, and the signal determining unit 180 and provides time information of each event. In the time information, an event response time is included.

The clock generator (not illustrated in the figure) provides extensibility of the multi-channel detector and enables a determination of the response time. The clock may operate in units of 10 kHz to 100 GHz so as to easily perform a precise time determination, outputs a signal that is output first at the time of driving a photodetector output channel reducing circuit and enables a determination of the time information. In addition, the clock generator provides time information such that a plurality of multi-channel detectors can be connected together and be simultaneously driven.

A main board (not illustrated in the figure) is an extension board connecting a plurality of multi-channel detectors, and the channel reduction rate changes in accordance with the number of driven multi-channel detectors. One to twenty multi-channel detectors can be extended to be driven, and a channel reduction rate can be adjusted so as to match a user's request. In addition, a signal determination circuit that can extract a signal from among outputs of the multi-channel detectors may be included therein.

The configuration of a multi-channel detector corresponding to a channel N-1, which includes an input differential amplifier 107, a linear amplifier 117, an offset correcting unit 127, a uniformity correcting unit 137, a signal delay unit 147, a lower-limit setting comparator 157, an upper-limit setting comparator 167, and an open/closed switch 177, is the same as that of the multi-channel detector corresponding to the channel 0 described above, and thus, the description thereof will not be presented.

Figure 2:
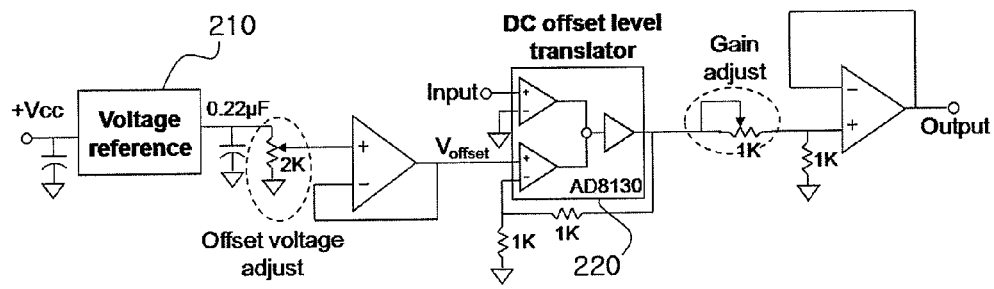
FIG. 2 is an example of an offset correcting circuit included in an offset correcting unit.

FIG. 2 is an example of the offset correcting circuit included in the offset correcting unit.

The offset level can be adjusted by changing the value of the variable resistor connected to the output terminal of a device (voltage reference circuit) 210 providing a reference voltage.

A DC offset level translator 220 uses an amplifier that is stable at a gain of "1".

In order to adjust the gain of the multi-channel detector according to an embodiment of the present disclosure, by changing the value of the variable resistor connected in series with the output terminal of the DC offset level translator 220, the gain is changeable in the range of one to two.

Figure 3:
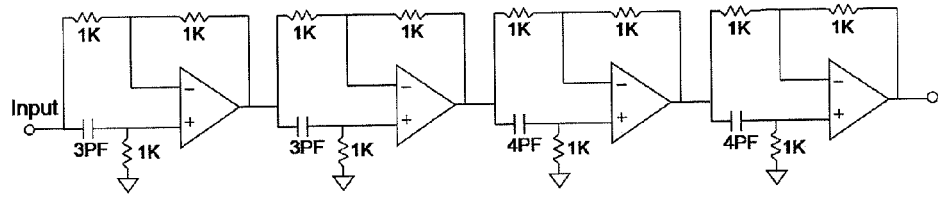
FIG. 3 is an example of a signal delay circuit included in a signal delay unit.

FIG. 3 is an example of a signal delay circuit included in the signal delay unit.

The circuit illustrated in FIG. 3 is a delay circuit having a delay time of 35 ns in the frequency range of 10 MHz to 15 MHz. Each amplifier illustrated in the figure is an amplifier having an amplification rate of "1".

Figure 4:
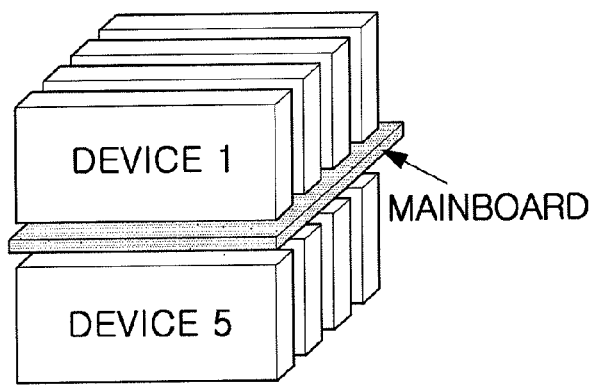
FIG. 4 illustrates an extended form in which eight multi-channel detectors according to an embodiment of the present disclosure are combined with a main board so as to operate as one.

FIG. 4 illustrates an extended form in which eight multi-channel detectors according to an embodiment of the present disclosure are combined with a main board so as to operate as one.

Figure 5:
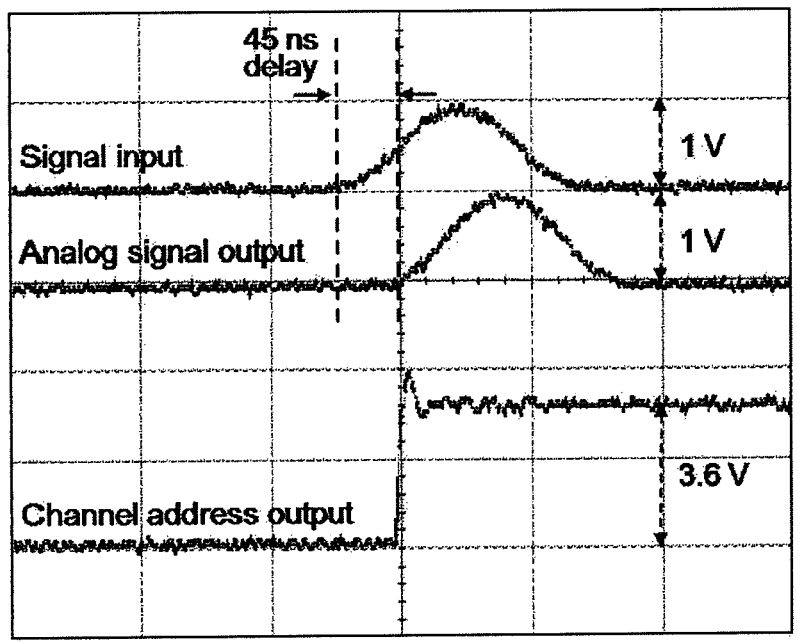
FIG. 5 illustrates a result of an offset error correction according to an amplification rate using an offset correcting circuit.

FIG. 5 illustrates a result of an offset error correction according to an amplification rate using the offset correcting circuit.

As the result of the offset error correction, it can be checked that there is no distortion of the signal.

Figure 6:
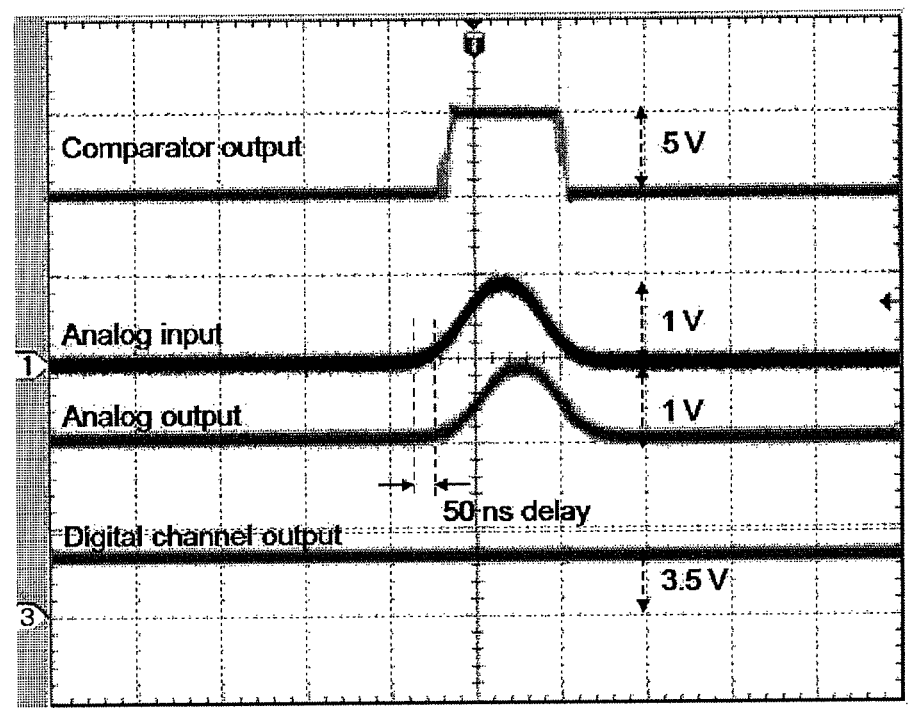
FIG. 6 illustrates output signals of a lower-limit setting comparator 150 and an upper-limit setting comparator 160 that are generated based on analog input signals and output signals of an energy information output unit 191, a position information output unit 192, and a time information output unit 193.

FIG. 6 illustrates output signals of the lower-limit setting comparator 150 and the upper-limit setting comparator 160 that are generated based on analog input signals and output signals of the energy information output unit 191, the position information output unit 192, and the time information output unit 193.

It can be checked that there is no position determination error, no count losses, and no distortion of the energy information, the time information is delayed by 50 ns as designed, and an output signal is generated with the delay.

Figure 7:
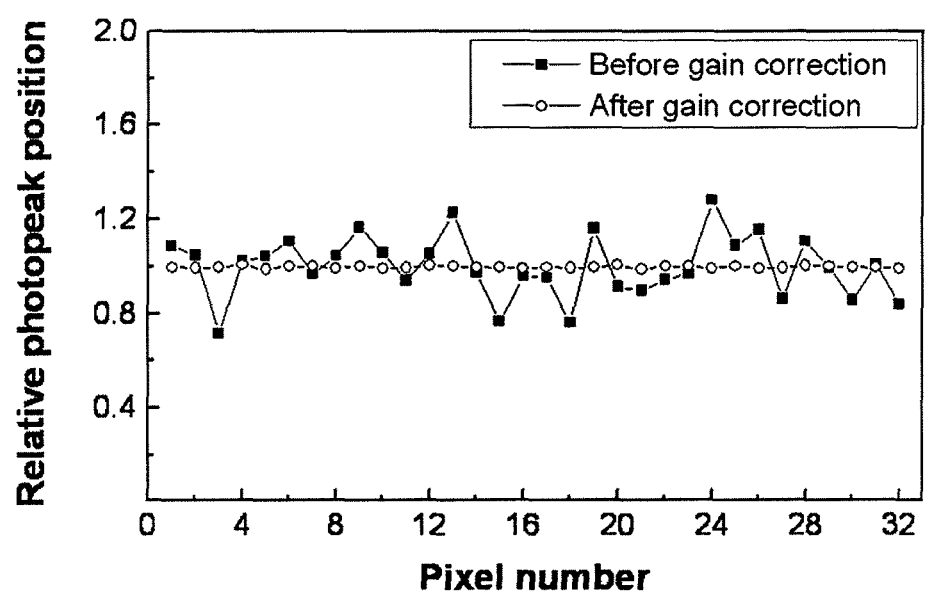
FIG. 7 illustrates a result of a correction of a non-uniform characteristic of an input signal using a uniformity correcting unit.

FIG. 7 illustrates a result of the correction of a non-uniform characteristic of an input signal using the uniformity correcting unit. By referring to FIG. 7, it can be understood that the non-uniformity error decreases from about 20% to about 0.3% or less.

While the exemplary embodiments have been shown and described, it will be understood by those skilled in the art that various changes in form and details may be made thereto without departing from the spirit and scope of this disclosure as defined by the appended claims. In addition, many modifications can be made to adapt a particular situation or material to the teachings of this disclosure without departing from the essential scope thereof. Therefore, it is intended that this disclosure not be limited to the particular exemplary embodiments disclosed as the best mode contemplated for carrying out this disclosure, but that this disclosure will include all embodiments falling within the scope of the appended claims.

[Industrial Applicability]

The present disclosure can be applied to an X-ray system and a PET image acquisition apparatus that are in one of optical application fields.

The invention claimed is:

1. A multi-channel detector having a reduced number of output channels, the multi-channel detector comprising:
    a linear amplifier linearly amplifying an input signal;
    an offset correcting unit configured by a circuit that is independent from the linear amplifier, including an operational amplifier inside, and correcting an offset level that changes in accordance with an amplification rate of the operational amplifier;
    a uniformity correcting unit reducing a non-uniform characteristic of the input signal by finely adjusting a gain of an output signal of the linear amplifier;
    a signal delay unit delaying an output signal of the uniformity correcting unit until a time point when output signals are generated from a comparison unit and a signal determining unit, and a switch circuit receives a trigger from the signal determining unit;
    a comparison unit comparing the output signal of the uniformity correcting unit with a signal of a predetermined level with each other;
    a signal determining unit receiving a trigger signal from the comparison unit, determining channel position information of a channel in which an event occurs, transmitting a trigger signal to a switch circuit located at the determined channel position, and outputting the determined position information; and
    a channel information processing unit receiving energy information, time information, or the channel position information of a channel in which an event occurs as input when a trigger signal is input from the signal determining unit to the switch circuit located at the determined channel position.

2. The multi-channel detector having a reduced number of output channels according to claim 1, wherein the comparison unit comprises:
    a lower-limit setting comparator determining whether the output signal of the uniformity correcting unit has a voltage of a predetermined level or higher; and
    an upper-limit setting comparator determining whether the output signal of the uniformity correcting unit has a voltage of a predetermined level or lower.

3. The multi-channel detector having a reduced number of output channels according to claim 1, wherein the channel information processing unit comprises:
    an energy information output unit receiving an output signal of the signal delay unit as the energy information when a trigger signal is input from the signal determining unit to the switch circuit;

a time information output unit receiving a trigger signal from the comparison unit or the signal determining unit as input and determining the time information; and a position information output unit receiving the channel position information of a channel in which an event occurs as input.

4. The multi-channel detector having a reduced number of output channels according to claim 2, wherein the lower-limit setting comparator and the upper-limit setting comparator are configured to be in parallel with each other.

5. The multi-channel detector having a reduced number of output channels according to claim 2, wherein the lower-limit setting comparator and the upper-limit setting comparator are configured to be in series with each other.

6. The multi-channel detector according to claim 2, wherein one or more trigger signals of each one of the lower-limit setting comparator and the upper-limit setting comparator are configured to be output together.

7. The multi-channel detector having a reduced number of output channels according to claim 1, wherein the time information includes a final response time.

8. The multi-channel detector having a reduced number of output channels according to claim 1, wherein the channel information processing unit outputs the energy information, the time information, and the channel position information of the channel in which the event occurs, which are received as input, together.

9. The multi-channel detector having a reduced number of output channels according to claim 2, wherein an event having a voltage of a specific level is extracted by using the lower-limit setting comparator and the upper-limit setting comparator.

10. The multi-channel detector having a reduced number of output channels according to claim 1, wherein the channel information processing unit determines a response time at which the event occurs when the channel position information of the channel in which the event occurs is received from the signal determining unit and further comprises a clock generator providing a clock signal for the channel information processing unit for determining the response time.

11. The multi-channel detector according to claim 1,
wherein a plurality of the multi-channel detectors are used, and
wherein an output channel reduction rate is decreased or increased by the signal determining unit and the channel information processing unit being used by the multi-channel detectors to be common.

* * * * *